(12) United States Patent
Van Der Gaag et al.

(10) Patent No.: US 9,575,406 B2
(45) Date of Patent: Feb. 21, 2017

(54) PUMP SYSTEM, A CARBON DIOXIDE SUPPLY SYSTEM, AN EXTRACTION SYSTEM, A LITHOGRAPHIC APPARATUS AND A DEVICE MANUFACTURING METHOD

(71) Applicants: Marc Léon Van Der Gaag, Veldhoven (NL); Leonarda Hendrika Van Den Heuvel, Aarle-Rixtel (NL); Arjan Hubrecht Josef Anna Martens, Valkenburg (NL); Frank Johannes Jacobus Van Boxtel, Eindhoven (NL)

(72) Inventors: Marc Léon Van Der Gaag, Veldhoven (NL); Leonarda Hendrika Van Den Heuvel, Aarle-Rixtel (NL); Arjan Hubrecht Josef Anna Martens, Valkenburg (NL); Frank Johannes Jacobus Van Boxtel, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 446 days.

(21) Appl. No.: 13/714,205

(22) Filed: Dec. 13, 2012

(65) Prior Publication Data

US 2013/0155380 A1     Jun. 20, 2013

Related U.S. Application Data

(60) Provisional application No. 61/578,114, filed on Dec. 20, 2011.

(51) Int. Cl.
*G03B 27/52* (2006.01)
*G03B 27/42* (2006.01)
(Continued)

(52) U.S. Cl.
CPC ............ *G03F 7/00* (2013.01); *G03F 7/70341* (2013.01); *Y10T 137/0396* (2015.04); *Y10T 137/8326* (2015.04); *Y10T 137/85986* (2015.04)

(58) Field of Classification Search
CPC ........................... G03F 7/708; G03F 7/70341
(Continued)

(56) References Cited

U.S. PATENT DOCUMENTS

| 4,509,852 A | 4/1985 | Tabarelli et al. |
| 4,632,275 A * | 12/1986 | Parks ................ B67D 1/0021 |
| | | 222/129.1 |

(Continued)

FOREIGN PATENT DOCUMENTS

| CN | 2077505 U | 5/1991 |
| EP | 1 420 298 | 5/2004 |

(Continued)

OTHER PUBLICATIONS

Japanese Office Action mailed Jan. 31, 2014 in corresponding Japanese Patent Application No. 2012-271675.

*Primary Examiner* — Hung Henry Nguyen
(74) *Attorney, Agent, or Firm* — Pillsbury Winthrop Shaw Pittman LLP

(57) ABSTRACT

An extraction system, including a pump to pump gas along a conduit to a check valve configured to open at an upstream pressure over a certain magnitude, a pressure sensor to generate a signal indicative of a pressure of gas between the pump and the check valve, and a controller configured to generate a stop signal if a signal from the pressure sensor indicates that the pressure of gas between the pump and the check valve is below a certain magnitude.

20 Claims, 7 Drawing Sheets

(51) Int. Cl.
  *G03F 7/00*   (2006.01)
  *G03F 7/20*   (2006.01)
(58) Field of Classification Search
  USPC .............................. 355/30, 53, 77; 62/501.1
  See application file for complete search history.

(56) References Cited

U.S. PATENT DOCUMENTS

| | | | |
|---|---|---|---|
| 4,699,505 A * | 10/1987 | Komoriya et al. | 355/30 |
| 4,977,747 A * | 12/1990 | Frejaville et al. | 62/50.1 |
| 7,903,232 B2 | 3/2011 | Leenders | |
| 8,587,762 B2 | 11/2013 | Streefkerk et al. | |
| 2004/0207824 A1 | 10/2004 | Lof et al. | |
| 2005/0282405 A1 | 12/2005 | Harpham et al. | |
| 2006/0038968 A1 | 2/2006 | Kemper et al. | |
| 2006/0050257 A1 | 3/2006 | Honda | |
| 2006/0082746 A1 | 4/2006 | Mertens et al. | |
| 2006/0158627 A1 | 7/2006 | Kemper et al. | |
| 2007/0085989 A1 | 4/2007 | Nagahashi et al. | |
| 2007/0243697 A1 | 10/2007 | Leenders et al. | |
| 2007/0244363 A1 * | 10/2007 | Sano et al. | 600/158 |
| 2008/0212046 A1 | 9/2008 | Riepen et al. | |
| 2009/0046358 A1 * | 2/2009 | Shimada | G02B 21/16 359/381 |
| 2009/0086175 A1 | 4/2009 | Streefkerk et al. | |
| 2009/0122283 A1 | 5/2009 | Hasegawa | |
| 2009/0134488 A1 | 5/2009 | Jansen et al. | |
| 2009/0174871 A1 | 7/2009 | De Jong et al. | |
| 2009/0279060 A1 | 11/2009 | Direcks et al. | |
| 2009/0279062 A1 | 11/2009 | Direcks et al. | |
| 2010/0230436 A1 | 9/2010 | O'Donnell | |
| 2010/0313974 A1 | 12/2010 | Riepen et al. | |
| 2011/0048295 A1 * | 3/2011 | Yamada et al. | 110/341 |
| 2011/0134401 A1 | 6/2011 | Rops et al. | |
| 2012/0062860 A1 | 3/2012 | Chonan | |
| 2012/0120376 A1 | 5/2012 | Bessems et al. | |

FOREIGN PATENT DOCUMENTS

| | | |
|---|---|---|
| JP | H09-186077 | 7/1997 |
| JP | H10-202045 | 8/1998 |
| JP | H11-132398 | 5/1999 |
| JP | 2000-133585 | 5/2000 |
| JP | 2002-260980 | 9/2002 |
| JP | 2003-102858 | 4/2003 |
| JP | 2004-258113 | 9/2004 |
| JP | 2005-142185 | 6/2005 |
| JP | 2005-223315 | 8/2005 |
| JP | 2007-115758 | 5/2007 |
| JP | 2007-142366 | 6/2007 |
| JP | 2008-008734 | 1/2008 |
| JP | 2009-088508 | 4/2009 |
| JP | 2009-130308 | 6/2009 |
| JP | 2010-098172 | 4/2010 |
| JP | 2011-052857 | 3/2011 |
| JP | 2011-165318 | 8/2011 |
| KR | 10-2008-0075727 | 8/2008 |
| WO | 99/49504 | 9/1999 |
| WO | 00/31780 | 6/2000 |
| WO | 2006/084641 | 8/2006 |
| WO | 2010/103822 | 9/2010 |

* cited by examiner

-- PRIOR ART --

-- PRIOR ART --

-- PRIOR ART --

PUMP SYSTEM, A CARBON DIOXIDE SUPPLY SYSTEM, AN EXTRACTION SYSTEM, A LITHOGRAPHIC APPARATUS AND A DEVICE MANUFACTURING METHOD

This application claims priority to U.S. provisional patent application no. U.S. 61/578,114, which was filed on Dec. 20, 2011, the content of which is incorporated herein in its entirety by reference.

FIELD

The present invention relates to a pump system, a carbon dioxide supply system, an extraction system, a lithographic apparatus and a device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

In an immersion apparatus, immersion fluid is handled by a fluid handling system, device structure or apparatus. In an embodiment the fluid handling system may supply immersion fluid and therefore be a fluid supply system. In an embodiment the fluid handling system may at least partly confine immersion fluid and thereby be a fluid confinement system. In an embodiment the fluid handling system may provide a barrier to immersion fluid and thereby be a barrier member, such as a fluid confinement structure. In an embodiment the fluid handling system may create or use a flow of gas, for example to help in controlling the flow and/or the position of the immersion fluid. The flow of gas may form a seal to confine the immersion fluid so the fluid handling structure may be referred to as a seal member; such a seal member may be a fluid confinement structure. In an embodiment, immersion liquid is used as the immersion fluid. In that case the fluid handling system may be a liquid handling system. In reference to the aforementioned description, reference in this paragraph to a feature defined with respect to fluid may be understood to include a feature defined with respect to liquid.

SUMMARY

If the immersion liquid is confined by a fluid handling system to a localized area on the surface which is under the projection system, a meniscus may extend between the fluid handling system and the surface. If the meniscus collides with a droplet on the surface, this may result in inclusion of a bubble in the immersion liquid. The droplet may be present on the surface for various reasons, including because of leaking from the fluid handling system. A bubble in immersion liquid can lead to imaging errors, for example by interfering with a projection beam during imaging of the substrate.

In order to address this, carbon dioxide may be provided radially outwardly of the meniscus. However, carbon dioxide can cause suffocation above a certain concentration and so is hazardous, for example, to human beings.

It is desirable, for example, to provide one or more components for the safe handling of carbon dioxide.

According to an aspect, there is provided an extraction system, comprising: a pump to pump gas along a conduit to a check valve configured to open at an upstream pressure over a certain magnitude; a pressure sensor to generate a signal indicative of a pressure of gas between the pump and the check valve; and a controller configured to generate a stop signal if a signal from the pressure sensor indicates that the pressure of gas between the pump and the check valve is below a certain magnitude.

According to an aspect, there is provided an extraction system for a lithographic apparatus, the system comprising: a conduit for a gas flow; a check valve in the conduit configured to open at an upstream pressure over a certain magnitude; a pump configured to pump the gas flow along the conduit to the check valve; a connector downstream of the check valve, the connector configured to fluidly connect the conduit to an external underpressure source to receive the gas flow from the conduit, the connector configured to form a connection with the external underpressure source which is fluidly connected to an ambient atmosphere.

According to an aspect, there is provided a pump system, comprising: a liquid lubricated pump adapted to pump a gas; a first container to receive gas and liquid from the pump, the first container comprising an exhaust outlet to provide gas therethrough and comprising an overflow outlet below the exhaust outlet to provide liquid therethrough; a second container in fluid communication with the overflow outlet, the second container comprising a drain outlet; a pump downstream of the drain outlet; and a check valve, downstream of the pump, configured to open at an upstream pressure over a certain magnitude.

According to an aspect, there is provided a lithographic apparatus comprising: a fluid handling system to provide a liquid to a space between a final element of a projection system and a facing surface and having a first gas outlet to supply a gas flow radially outward of a meniscus of liquid in the space; at least one second gas outlet radially outward of the first gas outlet to supply a flow of temperature conditioned gas onto an object; and a control system comprising a sensor to detect flow and/or pressure at or upstream of the at least one second gas outlet, the control system configured to stop the supply of the gas flow radially outward of the meniscus of liquid if a signal from the sensor indicates that flow and/or pressure at or upstream of the at least one second gas outlet is below a certain magnitude.

According to an aspect, there is provided a lithographic apparatus comprising: a volume to which carbon dioxide is supplied from a carbon dioxide supply; and a control system comprising a sensor to detect attempted access to and/or incorrect closure of the volume, the control system configured to stop supply of carbon dioxide to the volume if a signal from the sensor indicates attempted access to and/or incorrect closure of the volume.

According to an aspect, there is provided a carbon dioxide supply system to supply carbon dioxide from a source to a device, the supply system comprising: a supply line for the flow of carbon dioxide from the source to the device; a valve in the supply line, the valve having an open position and a closed position, where in the open position gas can flow along the supply line and in the closed position the flow of gas along the supply line is blocked; and a control system comprising: a first switch in the supply line to switch at a first flow rate or pressure of gas in the supply line, and a second switch in the supply line to switch at a second flow rate or pressure of gas in the supply line, wherein the control system is configured to move the valve to the closed position from the open position if (i) a signal from the first switch indicates that gas in the supply line is above a first flow rate or pressure or (ii) a signal from the second switch indicates that gas in the supply line is below the second flow rate or pressure.

According to an aspect, there is provided a lithographic apparatus comprising: a carbon dioxide supply system to provide carbon dioxide from a source to a device; and a control system configured to turn off the carbon dioxide supply system if one or more of the following occurs: (i) a pressure sensor generates a signal indicative of a pressure of gas between a pump and a check valve in an extraction system is below a certain magnitude; (ii) a sensor generates a signal indicative that flow rate and/or pressure at or upstream of a gas outlet to provide a flow of temperature conditioned gas is below a certain magnitude; (iii) a signal from a switch indicates that gas in a supply line of the carbon dioxide supply system is above a first flow rate or pressure or is below a second flow rate or pressure; and/or (iv) a signal from a sensor indicates an attempted access to a volume to which carbon dioxide is supplied from the carbon dioxide supply system.

According to an aspect, there is provided an extraction system, comprising: a conduit for a gas flow; a check valve in the conduit; a pump to pump the gas flow along the conduit to the check valve; a pressure sensor to generate a signal indicative of a gas pressure in the conduit between the pump and the check valve being below a certain magnitude; and a controller signally connected to at least the pressure sensor and configured to generate a stop signal on receipt of the signal generated by the pressure sensor.

According to an aspect, there is provided a method of controlling supply of carbon dioxide, wherein the carbon dioxide supply is turned off if one or more of the following occurs: (i) a pressure sensor generates a signal indicative of a pressure of gas between a pump and a check valve in an extraction system is below a certain magnitude; (ii) a sensor generates a signal indicative that flow rate and/or pressure at or upstream of a gas outlet to provide a flow of temperature conditioned gas is below a certain magnitude; (iii) a signal from a switch indicates that gas in a supply line of a carbon dioxide supply system is above a first flow rate or pressure or is below a second flow rate or pressure; and/or (iv) a signal from a sensor indicates an attempted access to a volume to which carbon dioxide is supplied from a carbon dioxide supply system.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
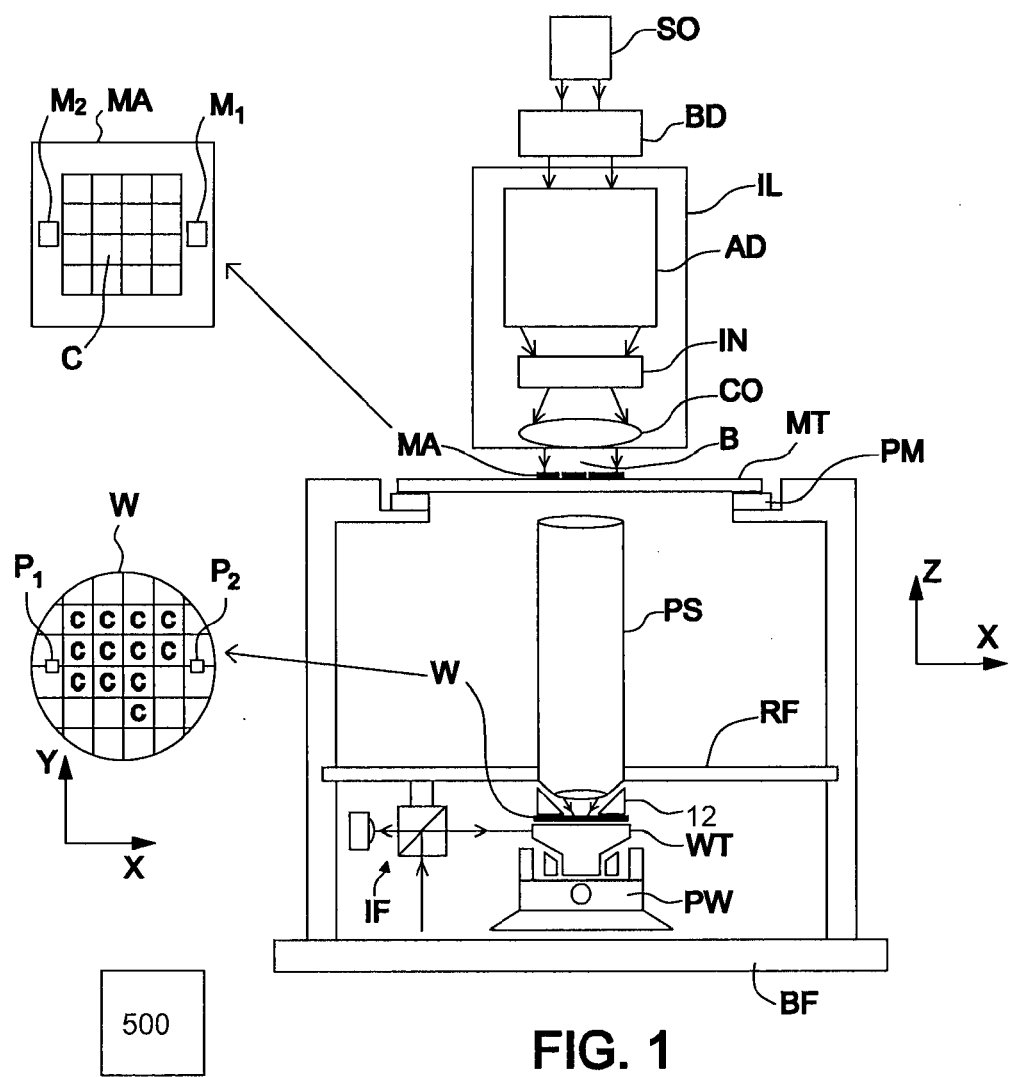
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device MA in accordance with certain parameters;

a support table, e.g. a sensor table to support one or more sensors or a substrate table WT constructed to hold a substrate (e.g. a resist-coated substrate) W, connected to a second positioner PW configured to accurately position the surface of the table, for example of a substrate W, in accordance with certain parameters; and a projection system (e.g. a refractive projection lens system) PS configured to project a pattern imparted to the radiation beam B by patterning device MA onto a target portion C (e.g. comprising part of, one, or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two or more tables (or stage(s) or support(s)), e.g., two or more substrate tables or a combination of one or more substrate tables and one or more sensor or measurement tables. In such "multiple stage" machines the multiple tables may be used in parallel, or preparatory steps may be carried out on one or more tables while one or more other tables are being used for exposure. The lithographic apparatus may have two or more patterning device tables (or stage(s) or support(s)) which may be used in parallel in a similar manner to substrate, sensor and measurement tables.

Referring to FIG. 1, the illuminator IL receives a radiation beam from a radiation source SO. The source SO and the lithographic apparatus may be separate entities, for example when the source SO is an excimer laser. In such cases, the source SO is not considered to form part of the lithographic apparatus and the radiation beam is passed from the source SO to the illuminator IL with the aid of a beam delivery system BD comprising, for example, suitable directing mirrors and/or a beam expander. In other cases the source SO may be an integral part of the lithographic apparatus, for example when the source SO is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions C (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion (and size of the exposure field) determines the height (in the scanning direction) of the target portion C.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

Although specific reference may be made in this text to the use of lithographic apparatus in the manufacture of ICs, it should be understood that the lithographic apparatus described herein may have other applications in manufacturing components with microscale, or even nanoscale, features, such as the manufacture of integrated optical systems, guidance and detection patterns for magnetic domain memories, flat-panel displays, liquid-crystal displays (LCDs), thin-film magnetic heads, etc.

Arrangements for providing liquid between a final element of the projection system PS and the substrate can be classed into three general categories. These are the bath type arrangement, the so-called localized immersion system and the all-wet immersion system. In a bath type arrangement substantially the whole of the substrate W and optionally part of the substrate table WT is submersed in a bath of liquid.

A localized immersion system uses a liquid supply system in which liquid is only provided to a localized area of the substrate. The space filled by liquid is smaller in plan than the top surface of the substrate and the volume filled with liquid remains substantially stationary relative to the projection system PS while the substrate W moves underneath that volume. FIGS. 2-5 show different supply devices which can be used in such a system. A sealing feature is present to seal liquid to the localized area. One way which has been proposed to arrange for this is disclosed in PCT patent application publication no. WO 99/49504.

In an all wet arrangement the liquid is unconfined. The whole top surface of the substrate and all or part of the substrate table is covered in immersion liquid. The depth of the liquid covering at least the substrate is small. The liquid may be a film, such as a thin film, of liquid on the substrate. Immersion liquid may be supplied to or in the region of a projection system and a facing surface facing the projection system (such a facing surface may be the surface of a substrate and/or a substrate table). Any of the liquid supply devices of FIGS. 2-5 can also be used in such a system. However, a sealing feature is not present, not activated, not as efficient as normal or otherwise ineffective to seal liquid to only the localized area.

Figure 2:
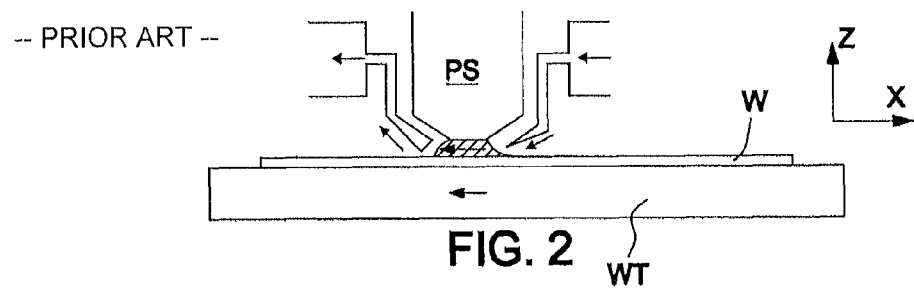
FIGS. 2 and 3 depict a liquid supply system for use in a lithographic projection apparatus.
Figure 3:
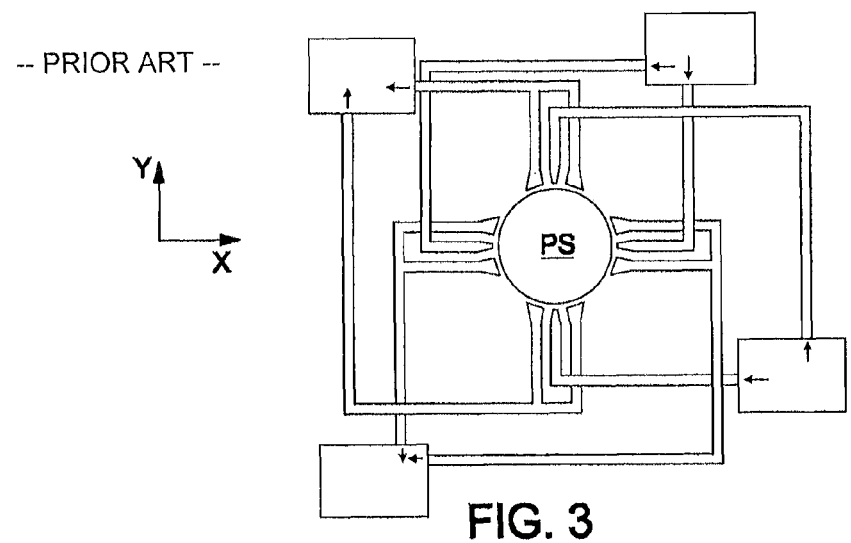

As illustrated in FIGS. 2 and 3, liquid is supplied by at least one inlet onto the substrate, preferably along the direction of movement of the substrate relative to the final element. Liquid is removed by at least one outlet after having passed under the projection system. As the substrate is scanned beneath the element in a −X direction, liquid is supplied at the +X side of the element and taken up at the −X side. FIG. 2 shows the arrangement schematically in which liquid is supplied via an inlet and is taken up on the other side of the element by an outlet which is connected to a low pressure source. In the illustration of FIG. 2 the liquid is supplied along the direction of movement of the substrate relative to the final element, though this does not need to be the case. Various orientations and numbers of in- and outlets positioned around the final element are possible; one example is illustrated in FIG. 3 in which four sets of an inlet with an outlet on either side are provided in a regular pattern around the final element. Note that the direction of flow of the liquid is shown by arrows in FIGS. 2 and 3.

Figure 4:
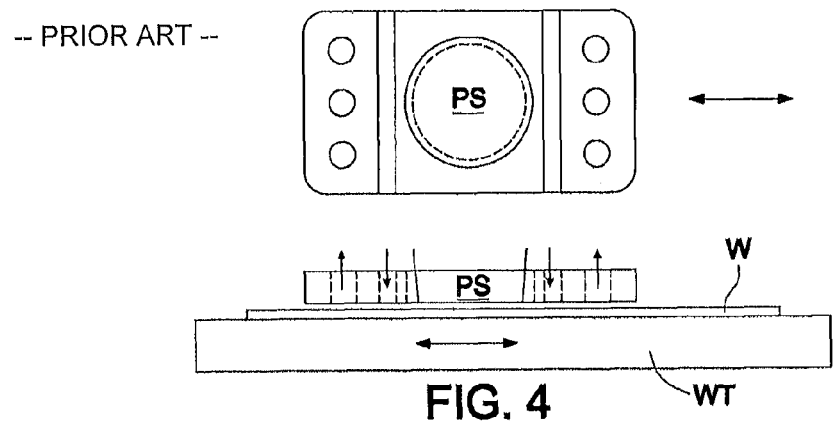
FIG. 4 depicts a further liquid supply system for use in a lithographic projection apparatus.

A further immersion lithography solution with a localized liquid supply system is shown in FIG. 4. Liquid is supplied by two groove inlets on either side of the projection system PS and is removed by a plurality of discrete outlets arranged radially outwardly of the inlets. The inlets can be arranged in a plate with a hole in its centre and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive). Note that the direction of flow of fluid and of the substrate is shown by arrows in FIG. 4.

Another arrangement which has been proposed is to provide the liquid supply system with a liquid confinement structure which extends along at least a part of a boundary of the space between the final element of the projection system and the substrate, substrate table or both. Such an arrangement is illustrated in FIG. 5.

Figure 5:
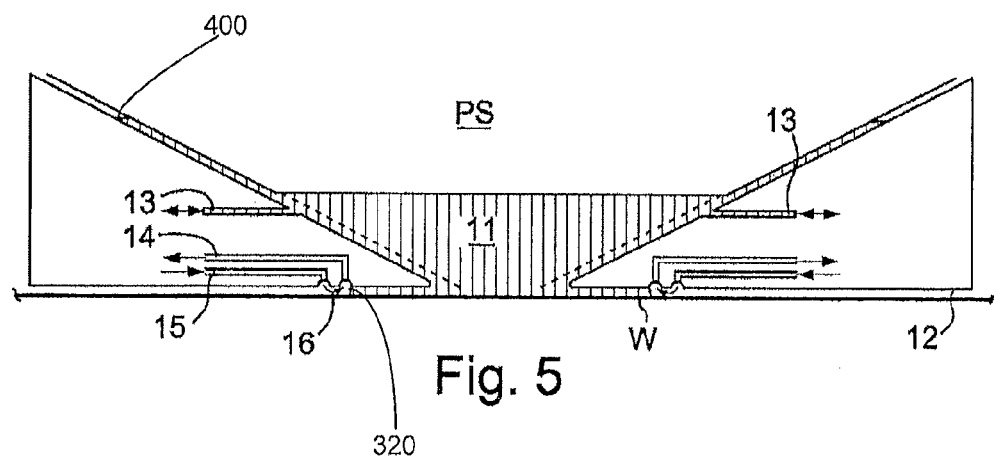
FIG. 5 depicts a further liquid supply system for use in a lithographic projection apparatus.

FIG. 5 schematically depicts a localized liquid supply system or fluid handling system with a liquid confinement structure 12, which extends along at least a part of a boundary of the space between the final element of the projection system and the substrate table WT or substrate W. (Please note that reference in the following text to surface of the substrate W also refers in addition or in the alternative to a surface of the substrate table, unless expressly stated otherwise.) The liquid confinement structure 12 is substantially stationary relative to the projection system in the XY plane though there may be some relative movement in the Z direction (in the direction of the optical axis). In an embodiment, a seal is formed between the liquid confinement structure 12 and the surface of the substrate W and which may be a contactless seal such as a gas seal (such a system with a gas seal is disclosed in European patent application publication no. EP-A-1,420,298) or a liquid seal.

The liquid confinement structure 12 at least partly contains liquid in the space 11 between a final element of the projection system PS and the substrate W. A contactless seal 16 to the substrate W may be formed around the image field of the projection system PS so that liquid is confined within the space between the substrate W surface and the final element of the projection system PS. The space 11 is at least partly formed by the liquid confinement structure 12 positioned below and surrounding the final element of the projection system PS. Liquid is brought into the space below the projection system PS and within the liquid confinement structure 12 by liquid inlet 13. The liquid may be removed by liquid outlet 13. The liquid confinement structure 12 may extend a little above the final element of the projection system. The liquid level rises above the final element so that a buffer of liquid is provided. In an embodiment, the liquid confinement structure 12 has an inner periphery that at the upper end closely conforms to the shape of the projection system or the final element thereof and may, e.g., be round. At the bottom, the inner periphery closely conforms to the shape of the image field, e.g., rectangular, though this need not be the case.

The liquid may be contained in the space 11 by a gas seal 16 which, during use, is formed between the bottom of the barrier member 12 and the surface of the substrate W. The gas seal is formed by gas. The gas in the gas seal is provided under pressure via inlet 15 to the gap between barrier member 12 and substrate W. The gas is extracted via outlet 14. The overpressure on the gas inlet 15, vacuum level on the outlet 14 and geometry of the gap are arranged so that there is a high-velocity gas flow 16 inwardly that confines the liquid. The force of the gas on the liquid between the barrier member 12 and the substrate W contains the liquid in a space 11. The inlets/outlets may be annular grooves which surround the space 11. The annular grooves may be continuous or discontinuous. The flow of gas 16 is effective to contain the liquid in the space 11. Such a system is disclosed in United States patent application publication no. US 2004-0207824, which is hereby incorporated by reference in its entirety. In an embodiment, the liquid confinement structure 12 does not have a gas seal.

An embodiment of the present invention may be applied to any fluid handling structure including those disclosed, for example, in United States patent application publication nos. US 2006-0158627, US 2006-0038968, US 2008-0212046, US 2009-0279060, US 2009-0279062, US 2004-0207824, US 2010-0313974 and US 2012-0120376, the contents of each of the foregoing hereby incorporated in its entirety by reference.

Localized area fluid handling systems such as those described above, with reference to FIGS. 2-5, can suffer from bubble inclusion into the space 11. As can be seen, a meniscus 320, for example, extends between the fluid handling system 12 and the surface under the fluid handling system 12. Similarly, a meniscus 400, for example, extends between the fluid handling system 12 and a surface of the projection system PS. The meniscus 320 illustrated in FIG. 5 defines the edge of the space 11. When the meniscus 320 collides with a droplet on the surface, for example a droplet of liquid which has escaped the space 11, a bubble of gas may be included into the space 11. Inclusion of a bubble into the space 11 is detrimental because a bubble of gas can lead to an imaging error, for example if the bubble interferes with the projection beam as it passes through the immersion liquid. A droplet is usually left behind on the surface in one of at least three circumstances: (a) when the liquid handling device is located over the edge of a substrate W and when there is relative movement between the liquid handling device and the substrate W; (b) when the liquid handling device is located over a step change in height of the facing surface facing the liquid confinement structure and when there is relative movement between the liquid handling device and the facing surface; and/or (c) due to too high relative speed between the liquid handling device and the facing surface, for example when the meniscus becomes unstable, e.g. by exceeding the critical scan speed of the facing surface i.e. relative to the liquid handling device.

A very small bubble of gas may dissolve in the immersion liquid before it reaches the exposure area of the space 11. Carbon dioxide ($CO_2$) typically dissolves faster than a bubble of air; so a bubble of carbon dioxide of certain dimensions would disappear more quickly than an air bubble of the same size. A bubble of $CO_2$ which has a solubility fifty-five (55) times larger than that of nitrogen and a diffusivity of 0.86 times that of nitrogen will typically dissolve in a time thirty-seven (37) times shorter than the time for a bubble of the same size of nitrogen to dissolve.

United States patent application publication no. US 2011-0134401, herein incorporated in its entirety by reference, describes supplying a gas with a solubility in the immersion liquid greater than $5\times10^{-3}$ mol/kg at 20° C. and 1 atm total pressure to a region adjacent the space 11. It also describes supplying a gas with a diffusivity in the immersion liquid greater than $3\times10^{-5}$ cm$^2$ s$^{-1}$ at 20° C. and 1 atm total pressure to a region adjacent the space 11. It also describes supplying a gas with a product of diffusivity and solubility in the immersion liquid of greater than that of air at 20° C. and 1 atm total pressure to a region adjacent the space 11.

If the bubble of gas is of a gas which has a high diffusivity, solubility or product of diffusivity and solubility in the immersion liquid, it will dissolve into the immersion liquid much faster. Therefore, providing $CO_2$, instead of an atmosphere of ambient air, radially outwards of the meniscus 320, 400 will reduce the number of imaging defects thereby allowing higher throughput (e.g., higher speed of the substrate W relative to the liquid handling system 12) and lower defectivity.

United States patent application publication no. US 2012-0120376 describes providing a gas supplying device configured to supply gas e.g. carbon dioxide to a region (e.g. to a volume, or a towards an area) adjacent the space 11. In particular, gas is provided such that it is present in the region adjacent to the meniscus 320 extending between the facing surface and the liquid handling device 12.

Carbon dioxide, at least in a concentration higher than ambient atmosphere, poses a risk to human safety. Therefore, a safety system should be provided to help ensure that the percentage of carbon dioxide in the atmosphere local to the lithographic apparatus does not build up to a concentration which poses a risk to human safety. Indeed, gas with a concentration of greater than 80% carbon dioxide must generally not be released into the atmosphere. A scrubber may be used to take out carbon dioxide from the gas to lower its concentration. In an alternative or additional system, the carbon dioxide in the gas can be recycled.

Leakage of carbon dioxide due to an open or broken connection is possible as well as due to malfunctioning of a valve or breakage of another component such as an extraction pump. These can lead to dangerous carbon dioxide leakage and subsequent build up to dangerous levels for example in the ambient atmosphere local to the lithographic apparatus.

Safety systems desirably do not use a sensor or sniffer to detect carbon dioxide. This is because for such a system the carbon dioxide would already have escaped and leaked from the system. Additionally a sensor would need to be so sensitive to carbon dioxide that it could be set off by human exhalation, which is clearly undesirable. In an embodiment of the invention any carbon dioxide leakage is detected as soon as it occurs or, if a system is used to reduce concentration of carbon dioxide which might otherwise build-up fails, the supply of carbon dioxide is stopped.

In an immersion lithographic apparatus carbon dioxide is generally supplied at or close to atmospheric pressure and is released into a gaseous environment. An embodiment of the present invention deals with such a system.

Figure 6:
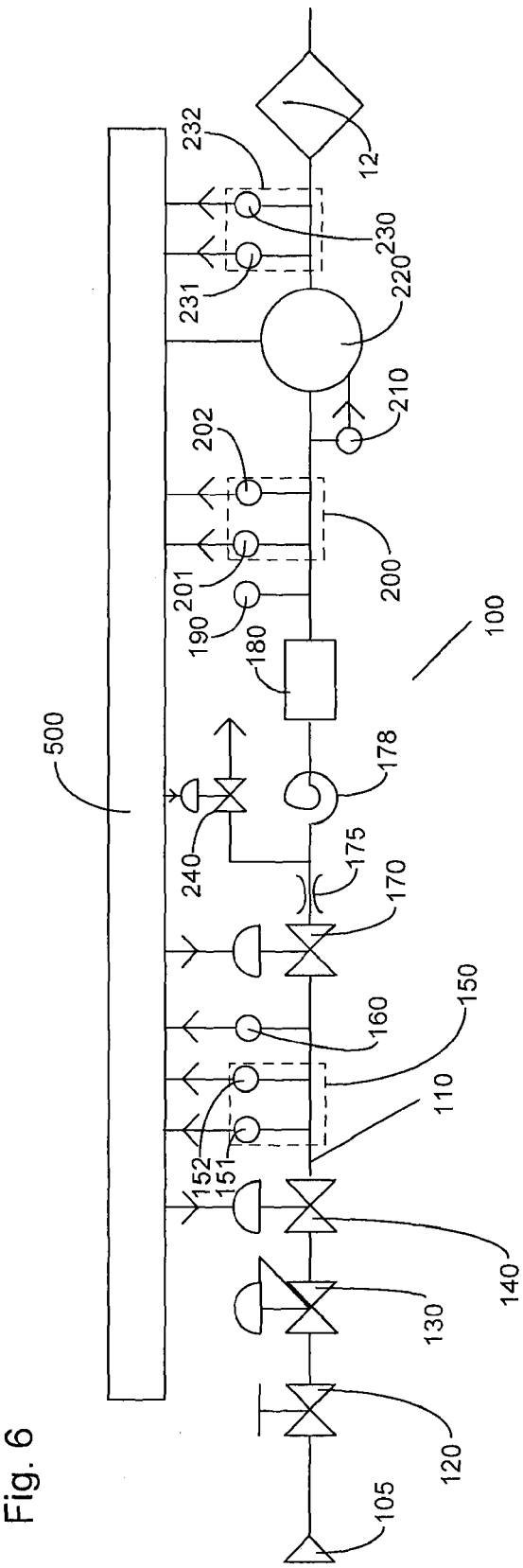
FIG. 6 depicts schematically an embodiment of a carbon dioxide supply system.
Figure 7:
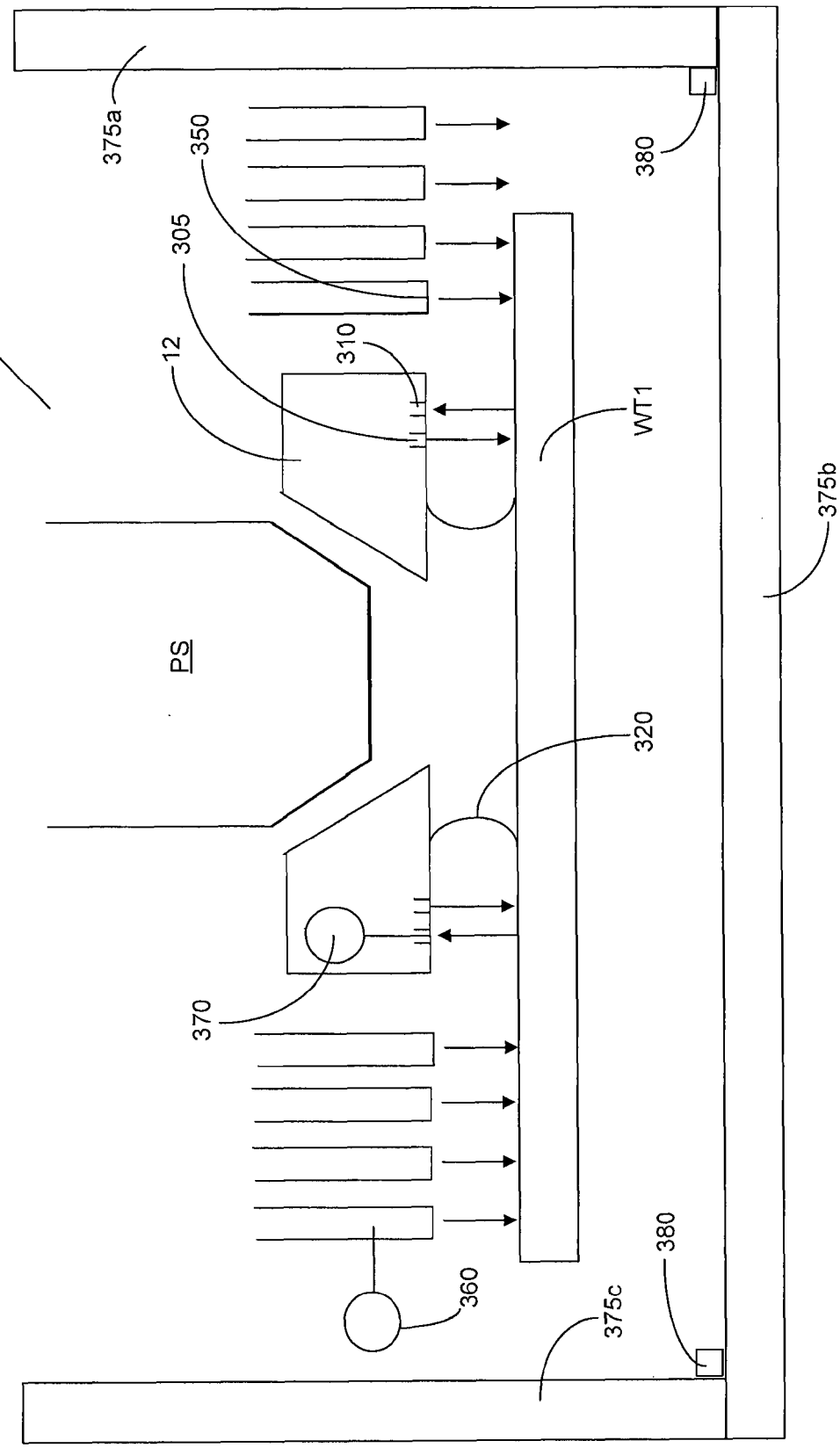
FIG. 7 depicts schematically a volume of a lithographic apparatus to which carbon dioxide is supplied.
Figure 8:
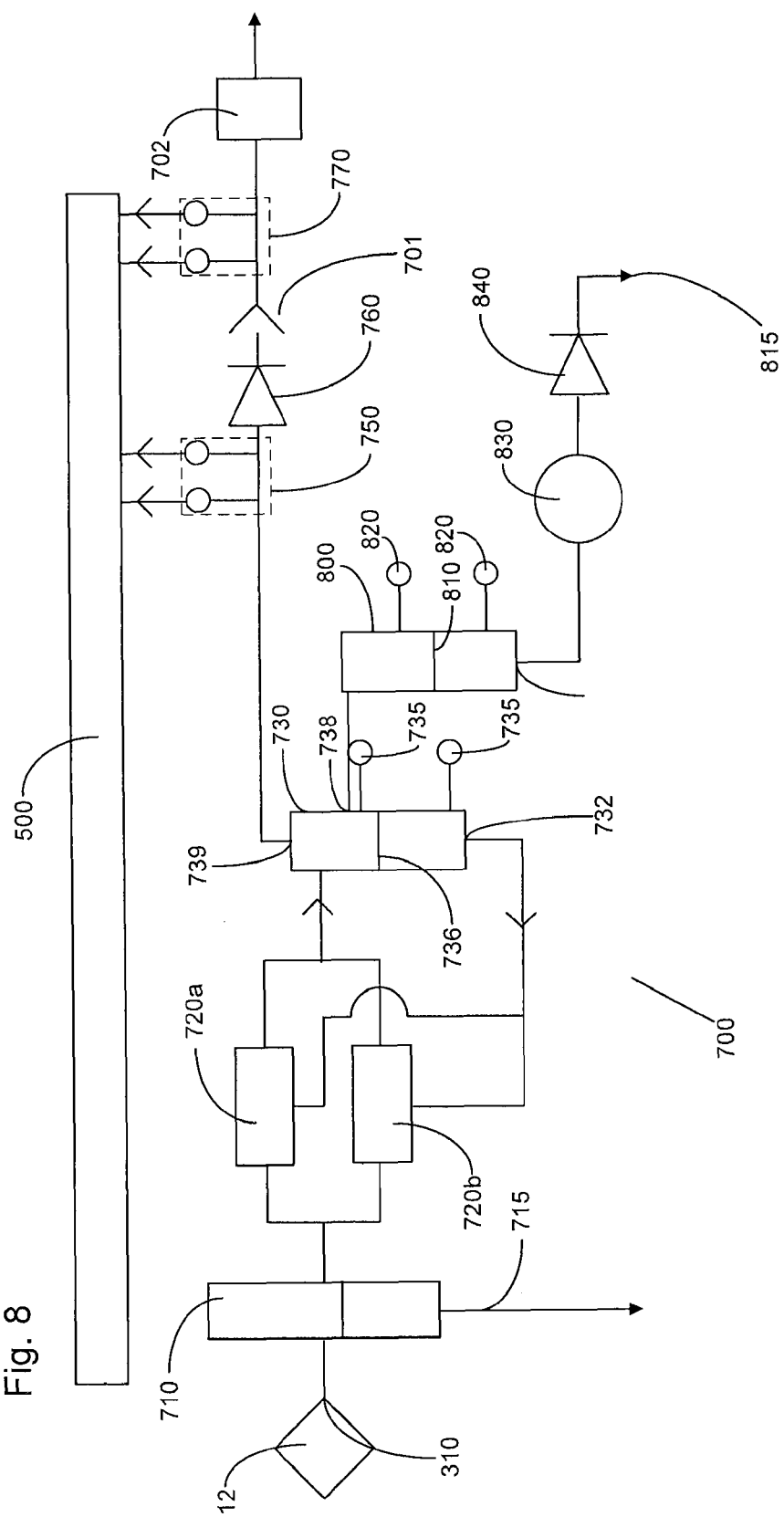
FIG. 8 depicts schematically an embodiment of an extraction and pump system.

The system of an embodiment of the present invention is divided into four parts. These are a supply system 100 such as illustrated in FIG. 6, a safety system around a volume 600 where the carbon dioxide is supplied (the volume around the fluid handling structure 12) as illustrated in FIG. 7 and an extraction system 700 as illustrated in FIG. 8. The fourth part is a central safety controller 500 which is designed for use with the safety system. In an embodiment the safety controller 500 is independent of any other system control, for example control of any substrate table or the projection system PS.

The carbon dioxide supply system 100 will now be described with reference to FIG. 6. In the carbon dioxide supply system 100 the safety controller 500 shuts off the supply of carbon dioxide if too high or too low a pressure of gas in a supply line 110 of the carbon dioxide supply system 100 is detected.

If the pressure of gas in the supply line 110 is too high, it may then be difficult to detect a leak. Additionally, if the pressure is too high this can indicate a malfunction of a pressure regulator 130, failure of a valve to close after being ordered to do so, or malfunction of the lock-out-tag-out (LOTO) valve 120 described below.

The safety controller 500 is configured to stop flow of carbon dioxide if the pressure in the supply line 110 is measured to be too low. This is indicative of the presence of a leak.

A carbon dioxide source 105 provides gas to the system 100. The gas is ducted, for example using hard ducting, to a manual LOTO valve 120. Downstream of the LOTO valve 120 is a pressure regulator 130 (possibly with a pressure gauge). The pressure regulator 130 functions to bring the pressure of carbon dioxide to a substantially fixed value for all possible supply pressures.

For safety reasons the carbon dioxide supply system 100 has two valves 140, 170. Both vales 140, 170 are opened in order to supply carbon dioxide along the supply line 110 to the device to which carbon dioxide is being supplied (for example a fluid handling system 12 as in the described embodiment). In an embodiment, the valves 140, 170 are normally closed valves such that if a signal is lost or supply of power is lost the supply of carbon dioxide will be cut off.

In an embodiment, the valves 140, 170 are actuated, for example by a normally closed solenoid. The valves 140, 170 are opened and closed under control of the safety controller 500.

A first switch 150 is in the supply line 110 downstream of the first valve 140. The first switch 150 is a flow rate or pressure switch. That is, the first switch switches output at a certain (e.g. predetermined) flow rate or pressure of gas in the supply line 110. In an embodiment the first switch is comprised of at least two switches 151, 152. This is built-in redundancy such that if one of the switches 151, 152 malfunctions, the other of the switches 151, 152 can still provide the relevant signal to the safety controller 500.

If a signal from the first switch 150 indicates that the flow rate or pressure of gas in supply line 110 is too high (e.g. above the predetermined flow rate or pressure) the safety controller 500 shuts down the supply of carbon dioxide (described below). The first switch 150 effectively checks whether the pressure regulator with pressure gauge 130 is operating correctly. If the pressure is too high it can be that a leak in the supply line 110 will go undetected.

A second pressure or flow rate switch 160 is provided in the supply line 110. If the second switch 160 supplies a signal to the safety controller 500 indicative that the flow rate or pressure in the supply line 110 is below a certain value (e.g. a predetermined value), the supply of gas by the carbon dioxide supply system 100 will be stopped. If a low pressure is detected in the supply line 110 downstream of the pressure regulator with pressure gauge 130, this is indicative of a leak in the supply system. The second switch 160 may comprise two switches, like the first switch 150.

Downstream of the second valve 170 is a flow restriction 175. The purpose of the flow restriction 175 is to reduce or minimize gas flow if a large leak occurs downstream of the flow restriction 175. A flexible coupling 178 may be provided to connect the components upstream of the flexible connection 178 to the remainder of the system. The flexible coupling 178 allows supply of carbon dioxide between two parts of an apparatus which may move relative to one another. The flexible coupling 178 may be provided elsewhere in the supply line 110.

Various components may be provided in the supply line 110, for example, a heater exchanger 180 and a pressure sensor 190 (the signal of which is used by a control system of the lithographic apparatus and not the safety controller 500). Further switches 200, 230 are also provided to indicate if the pressure or flow rate of gas in the supply line 110 is below a certain (e.g. predetermined) flow rate or pressure. Such an indication might indicate the presence of a leak. On receiving such an indication the safety controller 500 will shut down the supply system 100. The flow rate or pressure switch 200 is provided upstream of a pressure sensor 210 and associated mass flow controller 220. The pressure sensor 210 may be a pressure sensor or pressure switch. The flow rate or pressure switch 230 is provided downstream of the mass flow controller 220 and upstream of the fluid handling system 12.

The switches 200, 230 confirm that valve 170 is operating correctly and determine whether there is any leakage of gas from the supply line 110 downstream of the second switch 160. Switch 200 determines whether there is any leakage of gas from supply line upstream of the mass flow controller 220. Switch 230 checks for leakage downstream of the mass flow controller 220. The switches 200, 230 operate in the same way as switch 160 and have built-in redundancy by comprising at least two switches each 201, 202, 231, 232 in the same way as first switch 150.

In normal operation the mass flow controller 220 operates under control of a controller of the lithographic apparatus and based on the signal from the pressure sensor 210. However, the safety controller 500 is configured to turn off the mass flow controller 220 (i.e. turn the mass flow rate to zero) if a carbon dioxide leak or other fault is detected. This can result in a build-up of pressure in the supply line 110 between the source 105 and the mass flow controller 220. In order to deal with such a build-up of pressure and to reduce the level of pressure, a branch line with a branch line valve 240 is provided between the source 105 and the mass flow controller 220 (in an embodiment between the valve 170 and the mass flow controller 220). Under control of the safety controller 500, the pressure in the supply line 110, after stopping of the mass flow controller 220, can be reduced by opening a branch line valve 240. That gas may be allowed into the atmosphere or may be provided to an extraction system, such as described with reference to FIG. 8 below. The branch line valve 240 is, in an embodiment, a normally open valve for safety reasons. In an embodiment the branch line valve 240 is actuated, for example by a normally closed solenoid.

The use of pressure switches rather than pressure sensors can make the system robust. The robustness of the system may be enhanced by the provision of two valves 140, 170. The use of pressure switches rather than sensors which measure the absolute pressure is that this provides a digital input into the safety controller 500 rather than an analog input. This improves the safety of the device in terms of robustness as a whole.

Removing the carbon dioxide from the supply line 110 using the branch line valve 240 results in a pressure drop such that the pressure measured by the first switch 150 is low enough in order to enable the safety controller 500 to restart supply of carbon dioxide.

Either pressure or flow control may be used. In a pressure system pressure rather than flow rate is regulated.

More detail of the operation of the carbon dioxide supply system 100 will now be given.

First it is ensured that valve 240 in a branch line is closed. A delay of a certain time, say 3 seconds, is made between opening the valve 140 and checking the result from the second pressure switch 160 to verify that valve 140 has opened. After it has been verified that valve 140 has been opened, the second valve 170 is opened. After second valve 170 has been opened, the pressure is checked with pressure switch 200 to determine whether the valve 170 has correctly opened and that there is no leakage. After the verification that the second valve 170 has been opened, the mass flow controller 220 may be set to its set point. After a further delay, of say 5 seconds, the pressure switch 230 checks whether there is any leakage. The switches 160, 200, 230 constantly or regularly check whether any gas leakage is present when the apparatus is working.

When the carbon dioxide supply is to be switched off, for example deactivation or similar of the apparatus or because a leak or other emergency has been detected by the safety controller 500, desirably a certain order of events takes place. First the mass flow controller 220 is switched off or set to a mass flow rate of zero liters per minute. After a delay of time, valve 170 is closed. At the same time or shortly thereafter, valve 240 in a branch line is opened to release carbon dioxide which has built-up in the system between the time that the mass flow controller 220 is closed and the valve 170 is closed. After a further time the input into the safety controller 500 from the switches 200 is checked to see that the pressure has dropped. If the gas pressure has dropped, valve 140 is closed and valve 170 is opened. After a delay of a certain time, for example 3 seconds, the output of switch 160 is determined to see if valve 140 has correctly closed. After it has been determined that valve 140 is correctly closed, valve 170 as well as branch line valve 240 is closed, for example, if the pressure indicated by switch 160 and/or 200 indicates the pressure has dropped.

Pressure switches 150 and 200 detect if the system operates in the normal pressure range in a manner as described below. In an embodiment, during normal operation, the carbon dioxide pressure will be around 4.2 barg (bar gauge, e.g. a pressure measured in bars above ambient or atmospheric pressure) at pressure switches 150 and 160. The system is designed in a way that for the specified flows and ambient pressures the system has to function for, the maximum pressure drop between pressure switches 150 and 200 is 4.2−2.6=1.6 bar. During normal operation, the minimum carbon dioxide pressure will be around 2.6 barg at pressure switches 200. If the pressure is lower than 2.4 barg, a leakage in the system can be present. If the pressure at pressure switches 150 is higher than 5.0 barg, there is a risk that a leakage is not detected by pressure switch 200.

The carbon dioxide supplied by the carbon dioxide supply system 100 is provided, in an embodiment, to a fluid handling system 12 such as that shown in detail in FIG. 5. As illustrated in FIG. 7, the carbon dioxide is provided through an opening 305 in the fluid handling structure 12 radially outwardly of the meniscus 320 extending between the fluid handling structure 12 and the facing surface, for example a substrate on a substrate table WT1. Most of the carbon dioxide moving radially outwards out of opening 305 is extracted out of one or more collector (or recovery) openings 310 connected to an extraction system 700. An example extraction system 700 is illustrated in FIG. 8.

There is a chance that some of the carbon dioxide exiting opening 305 is not extracted via collector opening 310. An example of this is during table swap where substrate table WT1 is exchanged for another table under the projection system PS. During swap there may be a gap in the facing surface, between the exchanging tables. The provision of the gap may make recovery by the collector opening 310 of all the carbon dioxide supplied through the opening 350 difficult.

The occurrence of unrecovered carbon dioxide is acceptable if a large flow of gas into the volume 600 into which the carbon dioxide is supplied is present. In an embodiment at least one gas outlet 350 is provided radially outwardly of the opening 305 through which carbon dioxide is supplied to the volume 600. The flow of gas may conveniently be a flow of temperature conditioned gas onto a top surface of the substrate table. In an embodiment the gas in the gas flow is clean and/or dry. The flow of gas out of the gas outlet 350 is onto a portion of the top surface of the substrate table WT1 or an object on the top surface of the substrate table WT1 which is not currently under the projection system, as illustrated. The gas may be used to temperature condition the top surface of the substrate table WT1 not under the projection system PS.

As long as the high flow rate of gas out of gas outlet 350 continues, this will dilute the carbon dioxide out of opening 305 to a sufficient extent for it not to be dangerous. A sensor 360 is provided at or upstream of the gas outlet 350. The sensor 360 may be a sensor to determine the absolute pressure or flow rate of gas or may be a pressure or flow rate switch which switches at a certain (e.g. predetermined) flow rate or pressure. The output signal from the sensor 360 is provided to the safety controller 500. If the safety controller 500 determines that the flow rate of gas out of gas outlet 350 is insufficient (based on the signal from the sensor 360) then the supply of carbon dioxide by the carbon dioxide supply system 100 is stopped, as described above.

A pressure or flow rate sensor or switch 370 may be provided to measure the flow rate or pressure downstream of the collector opening 310. If the signal from the sensor 370 provided to the safety controller 500 indicates that the flow and/or pressure downstream of the collector opening 310 is outside a certain (e.g., predetermined) range, then supply of carbon dioxide from the carbon dioxide supply system 100 may be stopped by the safety controller 500.

An additional or alternative safety feature is providing walls 375a, b, c around the volume 600 to which carbon dioxide is provided. In order to gain access to the volume 600 at least one wall 375a, b, c is moved. In an embodiment, at least the moveable wall is a fluid curtain, such as a gas curtain. One or more sensors 380 are provided which can detect movement of one wall 375a, b, c relative to another wall 375a, b, c. The volume 600 is bounded by walls 375a, b, c. The sensor 380 is positioned to detect movement of and/or incorrect placement and thereby closure of at least two of the walls 375a, b, c. Thus, the sensor(s) 380 is/are configured to detect attempted access to and/or incorrect closure of the volume. The sensor 380 provides a signal to the safety controller 500. If an input to the safety controller 500 indicates that access is being attempted to be gained to the volume 600 or incorrect closure of the volume 600, the carbon dioxide supply system 100, if operational, can automatically be shut down. The interlocks provided by the switches 380 provide an extra safety feature because the concentration of carbon dioxide at the bottom of the volume 600 may be quite high if the extraction system is defective and/or the flow of gas from gas outlet 350 is insufficient.

FIG. 8 shows an extraction system 700 according to an embodiment of the present invention. The extraction system 700 is connected to the collector opening 310 of the fluid supply structure 12 and/or to the exit of the branch line valve 240 of FIG. 6.

An extractor 702, or evacuation source, may be provided. The extractor 702 may include a mechanism to recycle and/or scrub the gas. The extractor 702 may be part of the plant facilities of the building, or fab, in which the lithographic tool may be situated.

A mixture of liquid and gas may be extracted out of collection opening 310. The gas and liquid are first separated at a separation chamber 710. The separation chamber 710 may be constructed and arranged as disclosed in United States patent application publication nos. US 2005-0282405 and US 2006-0082746, which are both hereby incorporated in their entireties by reference. In an embodiment a drain 715 is provided at the bottom of collection chamber 710 to drain away collected liquid. That liquid may be disposed of or may be recycled or re-used.

Gas is provided from the separation chamber 710 to one or more pumps 720a, 720b. In an embodiment two pumps are provided in order to have enough capacity. In an embodiment the pumps are water sealed, such as in a liquid (e.g., water) ring pump. Such pumps 720a,b are preferred in order to achieve high flow rates. The pumps are comprised of metal impellers and metal housings which are sealed with liquid (e.g., water) so that there is substantially no metal to metal contact and thereby little wear. The pumps achieve high performance (little to no gas backflow over tips of the impeller blades) with low wear. This can result in liquid leaving the pump 720a, b along with gas. Priming liquid is in contact with carbon dioxide in the pump 720a, 720b.

Therefore, any excess liquid cannot be drained through an open system as carbon dioxide could also leak through such an open system. For this purpose excess liquid is diverted along with gas exiting the pump 720a, b into a first container 730. In the first container 730 the output from the pumps 720a, b is separated into liquid and gas. The liquid can be recycled through drain 732 back to the pumps 720a, b. A valve may be provided for this purpose. Two level detectors 735 may be used in order to maintain the level 736 of liquid below an overflow outlet 738.

The gas leaves the first container 730 via an exhaust outlet 739. The exhaust outlet 739 is provided above the overflow outlet 738. Thus substantially no liquid leaves the first container 730 through the exhaust outlet 739.

Between the collection opening 310 and pump 720a, b, the risk of a leak is low because the system is under an underpressure. In the extractor 702, the gas flow received from the evacuation system 700 is at an underpressure. However, a connection needs to be made between the evacuation system 700, which may be a machine situated in a factory building, and the extractor 702, which may be part of the plant facilities of a factory building. The extractor 702 may have to service many different machines located in the factory complex. The two underpressures in the evacuation system 700 and the extractor 702 may not be the same, and may vary relative to each other. In an embodiment, between the pumps 720a, b, such as extraction connector 701, and the extractor 702, the gas flow, including the recovered carbon dioxide, is not under vacuum. The flow is also variable because of the variable nature of carbon dioxide flow (the supply may be switched on and off during normal operation). Because the flow is variable it is difficult to design a closed pressure switch or switches solution such as described above with reference to FIG. 6.

The connection to the extractor 702 may be by way of the local ambient atmosphere. For example the inflow into the extractor may be higher than the outflow from an extraction connector 701 downstream of the check valve 760. The connection between the extraction connector 701 and the extractor 702 may have an opening to the local (e.g. ambient) atmosphere. In an embodiment the connector 701 is configured to fluidly connect to the extractor 702 without physical contact. In an embodiment, the extractor is located around, but does not contact an inlet opening of the extractor 702. Thus, the net gas inflow into the extractor is always larger than the gas outflow from the extractor 702. In this way, the risk of carbon dioxide gas escaping into the ambient atmosphere during the transfer between the evacuation system 700 and the extractor 702 is reduced.

A check valve 760 is provided downstream of the exhaust outlet 739. The check valve 760 is upstream of extraction connection 701. The check valve 760 opens when gas upstream of the check valve 760 is above a certain (e.g. predetermined) level. This means that the pressure of gas upstream of the check valve 760 must build-up before the check valve 760 opens. This allows a pressure sensor 750, which may be similar to the sensor 200, to be positioned upstream of the check valve 760 to detect for a leak. If the pressure detected by the sensor 750 is below a certain magnitude this is indicative of a leak and a signal is provided to the safety controller 500. The pressure sensor 750 may be a pressure switch or indeed may be two pressure switches, as indicated in FIG. 8, and as described above for example with reference to switch 200 in FIG. 6. An opening pressure of the check valve 760 may, for example, be 500 Pag (Pascal gauge).

Pressure sensor 770 (e.g. a pressure switch) may be provided downstream of the check valve 760. The pressure sensor 770 may be in signal communication with the safety controller 500. The pressure sensor 770 detects whether or not the extractor 702 is operational. If the pressure sensor 770 detects that a pressure is above a certain (e.g. predetermined) value, the supply of carbon dioxide by the carbon dioxide supply system 100 is stopped by the safety controller 500. The sensor 770 may be a pressure switch or a pressure sensor. If sensor 770 is a pressure switch, the switch may operate in the same way as switch 150 described above with reference to FIG. 6.

In operation there may be a delay of a certain time, for example 10 seconds, between turning on the carbon dioxide supply system 100 and using the sensor 750 to detect for the presence of a leak. This is because it may take some time for the pressure to build-up downstream of the first container 730.

If the level of liquid 736 in the first container 730 is below the overflow outlet 738 (as, in an embodiment, it should be) carbon dioxide could flow out of the overflow outlet 738. In order to alleviate this situation a second container 800 may be provided downstream of the overflow outlet 738. The second container 800 is designed always to be at least partly full of liquid (at a level 810 determined by sensors 820). Sensors 820 may be level detectors which may function as described with respect to the level detectors 738 for the first container 730, except as described below. Liquid is only pumped out of the second container 800 when the level 810 reaches a top sensor 820. A pump 830 is provided for this purpose.

In order to alleviate the situation where the bottom sensor 820 or controller for the pump 830 fail, a check valve 840 is provided downstream of the pump 830. The check valve 840 only opens at an upstream pressure over a certain magnitude. The certain magnitude is chosen such that such a magnitude could not be achieved by gas flow driven by pump 830 alone (e.g. the certain magnitude is higher than the opening pressure of check valve 760 added to the pressure generated by pump 830 when pumping gas). Hence carbon dioxide may not leave the system through the drain 815 even if the liquid level 810 in the second container 800 is allowed to drop completely away.

Figure 9:
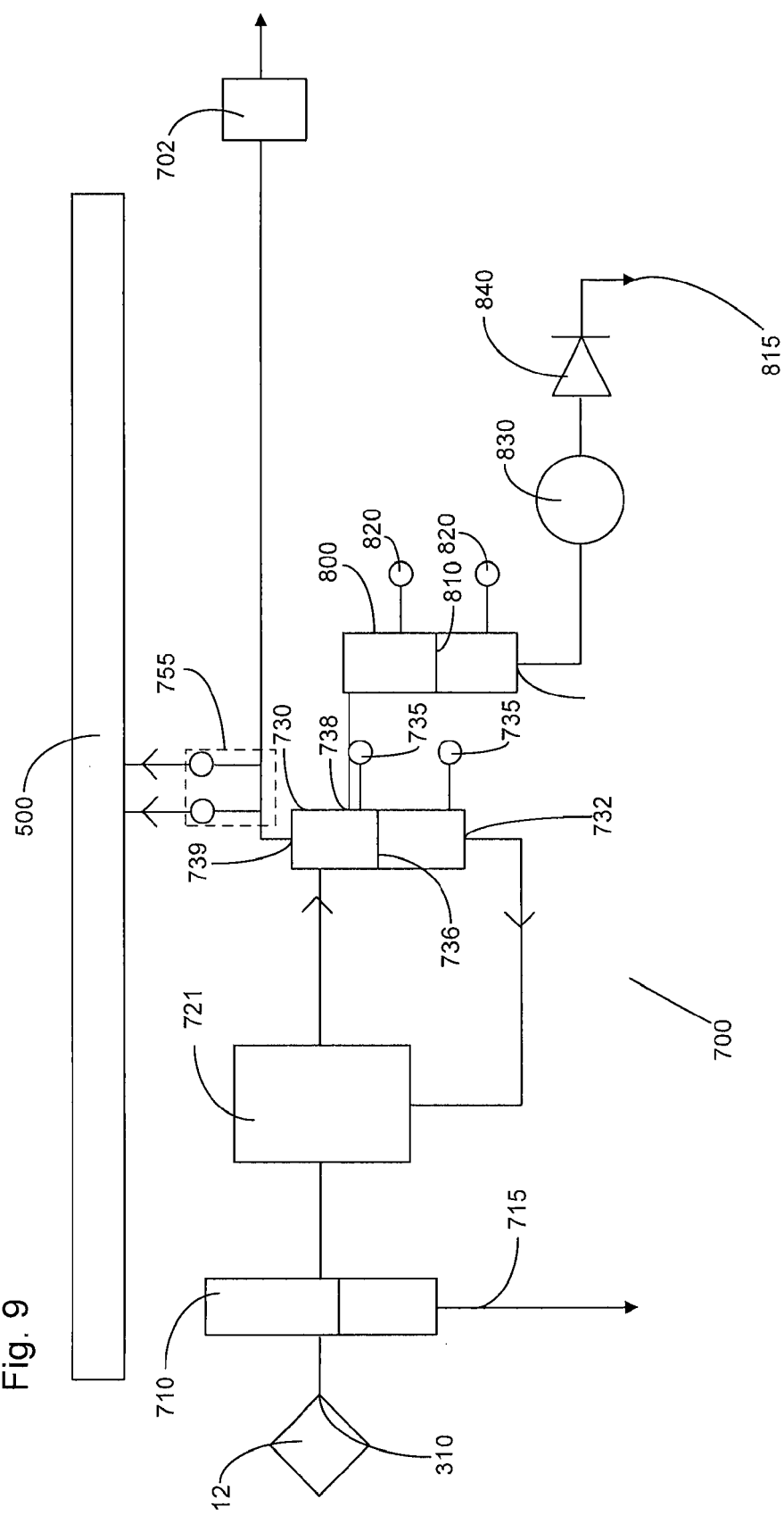
FIG. 9 depicts schematically an embodiment of an extraction and pump system.

A further embodiment of the extraction system 700 is shown in FIG. 9. The features in this embodiment function essentially in the same way as that shown in and described with reference to FIG. 8, and the same features take the same reference numbers, unless otherwise herein described. Pump 721 functions in the same way as pump 720 except that in the arrangement shown just one pump is shown. Any number of pumps, in series or in parallel, can be used, such as two pumps 720a, 720b in the arrangement of FIG. 8.

The embodiment of FIG. 9 differs from that of FIG. 8 in that the connection of the first container 730 to the extractor 702 is direct. The connection is not by way of the local ambient atmosphere. Therefore, the first container 730 is connected through the exhaust outlet 739 by a fluid line to the extractor 702. As the connection to the exhaust is direct, a check valve may not be required to reduce the risk of leaking carbon dioxide. A pressure sensor 755, similar to sensors 200, 750, 770, is provided in the fluid line to detect a leak, for example in the fluid line. If the sensor 755 detects a pressure below a certain magnitude, it is indicative of a leak and a signal is provided to the safety controller 500 to which the sensor 755 is connected. The pressure sensor 755 may be a pressure switch or indeed may be two pressure switches, for redundancy purposes, as indicated in FIG. 8, and as described above for example with reference to switch 200 in FIG. 6. As the fluid line between the exhaust outlet 739 and the extractor 702 is continuous, there is one pressure sensor 755 or set of sensors. (This is compared to two sensors 750, 770 as shown in FIG. 8).

The open connection in the extraction flow path in the embodiment shown in FIG. 8 is to enable effective extraction of the exhaust gas with an elevated carbon dioxide concentration under variable flow conditions. This is because the flow line to the extraction connection 701 is at an overpressure, the extraction connection 701 is at ambient pressure and the flow rate through the extractor 702 generates an underpressure. Because the substantially constant flow rate from the extraction connection 701 towards the extractor 702 exceeds the maximum flow rate into the extraction connection 701 from the container 730, substantially all the fluid flowing into the extraction connection 701 from the container 730 is extracted by the extractor. The arrangement is robust in having a large working flow and pressure range. However it is a complex design.

The system design can be simplified by removing the extraction connection 701 in the extraction fluid line, as in the embodiment shown in FIG. 9, and by selecting the working range of the pressure and flow regime. A suitable working range has a flow rate and a low pressure. For example, the fluid line between the exhaust outlet 739 and the extractor 702 may be at an underpressure, i.e. a vacuum. The underpressure is variable because the flow rate from the container 730 is variable. The fluid line is at an underpressure because the flow rate through the extractor 702 is higher than the maximum flow rate into the fluid line from the container 730. The carbon dioxide may be safely extracted.

Under certain pressure and flow regimes components in the fluid line to the extractor 702 may have insufficient sensitivity, e.g. sensors, or may be insufficiently robust, such as the extractor, to withstand the variable underpressures applied in the fluid line. This is compared to the arrangement shown in FIG. 8 in which the components either experience variable overpressures (between the container 730 and the extraction connection 701) or substantially constant underpressure (between the extraction connection 701 and the extractor 702). In such a pressure and flow regime, as compared to a variable underpressure regime, components such as the extractor 702 can expect to have a longer lifetime and other components such as the sensor 755 are more likely to be within their sensitivity range than a variable underpressure regime. Therefore, although the pressure and flow in the extraction flow line are still variable, the flow regime is selected so that the variability does not affect the operation of the extraction system and its components. The design of the extraction fluid line can therefore be selected to suit the operating pressure and flow rate to help ensure sufficient lifetime, accuracy and simplicity of design.

In a first aspect of the invention there is provided an extraction system, comprising: a pump to pump gas along a conduit to a check valve configured to open at an upstream pressure over a certain magnitude; a pressure sensor to generate a signal indicative of a pressure of gas between the pump and the check valve; and a controller configured to generate a stop signal if a signal from the pressure sensor indicates that the pressure of gas between the pump and the check valve is below a certain magnitude.

The pressure sensor may be a pressure switch to switch at a certain pressure of gas between the pump and the check valve. The extraction system may comprise a underpressure source downstream of the check valve. The extraction system may comprise a further pressure sensor, downstream of the check valve, to generate a signal indicative of a pressure of gas downstream of the check valve. The controller may be configured to generate a stop signal if a signal from the further pressure sensor indicates that pressure of gas downstream of the check valve is above a certain magnitude. The extraction system may comprise a connector downstream of the check valve, the connector configured to connect the conduit to an external underpressure source to receive the gas flow.

In a second aspect of the invention there is provided an extraction system for a lithographic apparatus, the system comprising: a conduit for a gas flow; a check valve in the conduit configured to open at an upstream pressure over a certain magnitude; a pump configured to pump the gas flow along the conduit to the check valve; a connector downstream of the check valve, the connector configured to fluidly connect the conduit to an external underpressure source to receive the gas flow from the conduit, the connector configured to form a connection with the external underpressure source which is fluidly connected to an ambient atmosphere.

The connector may comprise an opening to the ambient atmosphere. The connector may be configured to fluidly connect to the underpressure source without physical contact. The underpressure source may be a gas extractor, for example of a factory.

In a third aspect of the invention there is provided a lithographic apparatus comprising: an evacuation system according the first or second aspect; and a gas supply, the stop signal from the controller stopping the gas supply and/or the pump.

In a fourth aspect of the invention there is provided a pump system, comprising: a liquid lubricated pump adapted to pump a gas; a first container to receive gas and liquid from the pump, the first container comprising an exhaust outlet to provide gas therethrough and comprising an overflow outlet below the exhaust outlet to provide liquid therethrough; a second container in fluid communication with the overflow outlet, the second container comprising a drain outlet; a pump downstream of the drain outlet; and a check valve, downstream of the pump, configured to open at an upstream pressure over a certain magnitude.

The pump system may comprise a level sensor to detect a level of liquid in the second container and a controller configured to control the pump based on a signal from the level sensor to operate to keep the level of liquid in the container in a certain range.

In a fifth aspect of the invention there is provided a lithographic apparatus comprising: a fluid handling system to provide a liquid to a space between a final element of a projection system and a facing surface and having a first gas outlet to supply a gas flow radially outward of a meniscus of liquid in the space; a second gas outlet radially outward of the first gas outlet to supply a flow of temperature conditioned gas onto an object; and a control system comprising a sensor to detect flow and/or pressure at or upstream of the second gas outlet, the control system configured to stop the supply of the gas flow radially outward of the meniscus of liquid if a signal from the sensor indicates that flow and/or pressure at or upstream of the second gas outlet is below a certain magnitude.

The sensor may be a pressure or flow rate switch which switches at a certain pressure or flow rate of gas at or upstream of the second gas outlet. The fluid handling system may comprise a collector opening radially outward of the first gas outlet. The lithographic apparatus may comprise a sensor downstream of the collector opening, wherein the control system is configured to stop the flow of gas radially outward of the meniscus of liquid if a signal from the sensor indicates that flow and/or pressure downstream of the collector opening is outside a certain range. The sensor may be a switch. The lithographic apparatus may comprise at least two tables configured to move under the fluid handling structure. The second gas outlet may be directed to provide the flow of temperature conditioned gas onto an area of an object on a table under the fluid handling structure uncovered by the fluid handling structure.

In a sixth aspect of the invention there is provided a lithographic apparatus comprising: a volume to which carbon dioxide is supplied from a carbon dioxide supply; and a control system comprising a sensor to detect attempted access to and/or incorrect closure of the volume, the control system configured to stop supply of carbon dioxide to the volume if a signal from the sensor indicates attempted access to and/or incorrect closure of the volume.

The volume may be bounded by walls. The sensor may be positioned to detect movement apart of the walls.

In a seventh aspect of the invention there is provided a carbon dioxide supply system to supply carbon dioxide from a source to a device, the supply system comprising: a supply line for the flow of carbon dioxide from the source to the device; a valve in the supply line, the valve having an open position and a closed position, where in the open position gas can flow along the supply line and in the closed position the flow of gas along the supply line is blocked; and a control system comprising: a first switch in the supply line to switch at a first flow rate or pressure of gas in the supply line, and a second switch in the supply line to switch at a second flow rate or pressure of gas in the supply line, wherein the control system is configured to move the valve to the closed position from the open position if (i) a signal from the first switch indicates that gas in the supply line is above a first flow rate or pressure or (ii) a signal from the second switch indicates that gas in the supply line is below the second flow rate or pressure.

The valve may be a normally closed valve. The first switch, the second switch, or both, may switch at a certain pressure. The supply system may comprise a mass flow controller in the supply line. The control system may be configured to switch off the mass flow controller if (i) a signal from the first switch indicates that gas in the supply line is above a first flow rate or pressure or (ii) a signal from the second switch indicates that gas in the supply line is below the second flow rate or pressure. The supply system may comprise a further second switch, in the supply line downstream or upstream of the mass flow controller, to switch at a certain flow rate or pressure of gas in the supply line and wherein the control system is configured to move the valve to the closed position and/or turn the mass flow controller off if a signal from the further second switch indicates that gas in the supply line is below the certain flow rate or pressure. The supply system may comprise a branch line that is off the supply line downstream of the valve and upstream of the mass flow controller, the control system configured to open a branch line valve in the branch line after moving the valve to the closed position to reduce pressure in the supply line between the valve and the mass flow controller. The supply system may comprise a further first switch, in the supply line, to switch at the first flow rate or pressure of gas in the supply line.

In an eighth aspect of the invention there is provided a lithographic apparatus and a carbon dioxide supply system, wherein: the lithographic apparatus is a lithographic apparatus according to the third, fifth or sixth aspects of the invention and the carbon dioxide supply system is a carbon dioxide supply system according to the seventh aspect of the invention.

The lithographic apparatus and carbon dioxide supply system may comprise an extraction system according to the first or second aspect of the invention and/or a pump system according to the fourth aspect of the invention.

In a ninth aspect of the invention there is provided a lithographic apparatus comprising: a carbon dioxide supply system to provide carbon dioxide from a source to a device; and a control system configured to turn off the carbon dioxide supply system if one or more of the following occurs: (i) a pressure sensor generates a signal indicative of a pressure of gas between a pump and a check valve in an extraction system is below a certain magnitude; (ii) a sensor generates a signal indicative that flow rate and/or pressure at or upstream of a gas outlet to provide a flow of temperature conditioned gas is below a certain magnitude; (iii) a signal from a switch indicates that gas in a supply line of the carbon dioxide supply system is above a first flow rate or pressure or is below a second flow rate or pressure; and/or (iv) a signal from a sensor indicates an attempted access to a volume to which carbon dioxide is supplied from the carbon dioxide supply system.

In a tenth aspect of the invention there is provided an extraction system, comprising: a conduit for a gas flow; a check valve in the conduit; a pump to pump the gas flow along the conduit to the check valve; a pressure sensor to generate a signal indicative of a gas pressure in the conduit between the pump and the check valve being below a certain magnitude; and a controller signally connected to at least the pressure sensor and configured to generate a stop signal on receipt of the signal generated by the pressure sensor.

The extraction system may comprise a check valve to open at an upstream pressure over a certain magnitude.

In an eleventh aspect of the invention, there is provided a method of controlling supply of carbon dioxide, wherein the carbon dioxide supply is turned off if one or more of the following occurs: (i) a pressure sensor generates a signal indicative of a pressure of gas between a pump and a check valve in an extraction system is below a certain magnitude; (ii) a sensor generates a signal indicative that flow rate and/or pressure at or upstream of a gas outlet to provide a flow of temperature conditioned gas is below a certain magnitude; (iii) a signal from a switch indicates that gas in a supply line of a carbon dioxide supply system is above a first flow rate or pressure or is below a second flow rate or pressure; and/or (iv) a signal from a sensor indicates an attempted access to a volume to which carbon dioxide is supplied from a carbon dioxide supply system.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains one or multiple processed layers.

The terms "radiation" and "beam" used herein encompass all types of electromagnetic radiation, including ultraviolet (UV) radiation (e.g. having a wavelength of or about 436, 405, 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

Any controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage media for storing such computer programs, and/or hardware to receive such media. So the controller(s) may operate according the machine readable instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more fluid openings including one or more liquid openings, one or more gas openings or one or more openings for two phase flow. The openings may each be an inlet into the immersion space (or an outlet from a fluid handling structure) or an outlet out of the immersion space (or an inlet into the fluid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus comprising:
a carbon dioxide supply system to provide carbon dioxide from a source to a first gas outlet;
a fluid handling system to provide a liquid to a space between a final element of a projection system and a facing surface and having the first gas outlet to supply a gas flow radially outward of a meniscus of liquid in the space;
a second gas outlet radially outward of the first gas outlet to supply a flow of temperature conditioned gas, separate from the carbon dioxide supply, onto an object; and
a control system comprising a sensor to detect flow and/or pressure at or upstream of the second gas outlet, the control system configured to stop the supply of the gas flow radially outward of the meniscus of liquid if a signal from the sensor indicates that flow and/or pressure at or upstream of the second gas outlet is below a certain magnitude.

2. The lithographic apparatus of claim 1, wherein the sensor is a pressure or flow rate switch which switches at a certain pressure or flow rate of gas at or upstream of the second gas outlet.

3. The lithographic apparatus of claim 1, wherein the fluid handling system further comprises a collector opening radially outward of the first gas outlet.

4. The lithographic apparatus of claim 3, further comprising a sensor downstream of the collector opening, wherein the control system is configured to stop the flow of gas radially outward of the meniscus of liquid if a signal from the sensor indicates that flow and/or pressure downstream of the collector opening is outside a certain range.

5. The lithographic apparatus of claim 1, further comprising at least two tables configured to move under the fluid handling structure.

6. The lithographic apparatus of claim 1, wherein the second gas outlet is directed to provide the flow of temperature conditioned gas onto an area of an object on a table under the fluid handling structure uncovered by the fluid handling structure.

7. A lithographic apparatus comprising:
a carbon dioxide supply system to provide carbon dioxide from a source to a device;
a volume to which carbon dioxide is supplied from the carbon dioxide supply system;
a flow rate or pressure switch in a supply line of the carbon dioxide supply system, the switch located downstream from a pressure regulator in the supply line and the pressure regulator being upstream of a gas valve in the supply line;
a sensor to detect attempted opening and/or incorrect closure of a wall of the volume; and
a control system configured to stop supply of carbon dioxide to the volume if a signal from the sensor indicates attempted access to and/or incorrect closure of the volume and configured to stop supply of carbon dioxide to the volume if a signal from the flow rate or pressure switch that indicates that gas in the supply line is above respectively a first flow rate or pressure or is below respectively a second flow rate or pressure.

8. The lithographic apparatus of claim 7, wherein the volume is bounded by walls and the sensor is positioned to detect movement of a part of the walls.

9. A lithographic apparatus comprising:
a carbon dioxide supply system to supply carbon dioxide from a source to a device, the supply system comprising:
a supply line for the flow of carbon dioxide from the source to the device;
a valve in the supply line, the valve having an open position and a closed position, where in the open position gas can flow along the supply line and in the closed position the flow of gas along the supply line is blocked;
a pressure regulator in the supply line, the pressure regulator being upstream of the valve; and
a control system comprising:
a first flow rate or pressure switch in the supply line to switch at respectively a first flow rate or pressure of gas in the supply line, and
a second flow rate or pressure switch in the supply line to switch at respectively a second flow rate or pressure of gas in the supply line,
wherein the control system is configured to move the valve to the closed position from the open position if (i) a signal from the first switch, located downstream from the pressure regulator, indicates that gas in the supply line is above a first flow rate or pressure or (ii) a signal from the second switch, located downstream from the pressure regulator, indicates that gas in the supply line is below the second flow rate or pressure.

10. The supply system of claim 9, wherein the valve is a normally closed valve.

11. The supply system of claim 9, wherein the first switch, the second switch, or both, switch at a certain pressure.

12. The supply system of claim 9, further comprising a mass flow controller in the supply line.

13. The supply system of claim 12, wherein the control system is configured to switch off the mass flow controller if (i) a signal from the first switch indicates that gas in the supply line is above a first flow rate or pressure or (ii) a signal from the second switch indicates that gas in the supply line is below the second flow rate or pressure.

14. A lithographic apparatus comprising:
a carbon dioxide supply system to provide carbon dioxide from a source to a device; and
an extraction system, comprising:
a pump to pump gas along a conduit to a check valve configured to open at an upstream pressure over a certain magnitude;
a pressure sensor to generate a signal indicative of a pressure of gas in a line connecting the pump to the check valve; and
a control system configured to generate a stop signal if a signal from the pressure sensor indicates that the pressure of gas in the line connecting the pump to the check valve is below a certain magnitude.

15. A lithographic apparatus comprising:
a carbon dioxide supply system to provide carbon dioxide from a source to a device; and
an extraction system, the extraction system comprising:
a conduit for a gas flow;
a check valve in the conduit configured to open at an upstream pressure over a certain magnitude;

a pump configured to pump the gas flow along the conduit to the check valve;

a pressure sensor configured to provide a signal indicative of a pressure of gas in a line connecting the pump to the check valve;

a connector downstream of the check valve, the connector configured to fluidly connect the conduit to an external underpressure source to receive the gas flow from the conduit, the connector configured to form a connection with the external underpressure source which is fluidly connected to an ambient atmosphere; and a control system configured to turn off the carbon dioxide supply system if the pressure sensor provides a signal indicative of a pressure of gas in the line connecting the pump to the check valve that is below a certain magnitude.

16. A lithographic apparatus comprising:

a carbon dioxide supply system to provide carbon dioxide from a source to a device; and an evacuation system, comprising:
 a pump to pump gas along a conduit to a check valve configured to open at an upstream pressure over a certain magnitude;
 a pressure sensor to generate a signal indicative of a pressure of gas in a line connecting the pump to the check valve; and
 a control system configured to generate a stop signal if a signal from the pressure sensor indicates that the pressure of gas in the line connecting the pump to the check valve is below a certain magnitude; and
 a gas supply, the stop signal from the control system stopping the gas supply and/or the pump.

17. A lithographic apparatus and a carbon dioxide supply system, wherein:

the carbon dioxide supply system comprises:
 a supply line for the flow of carbon dioxide from a source to a device;
 a valve in the supply line, the valve having an open position and a closed position, where in the open position gas can flow along the supply line and in the closed position the flow of gas along the supply line is blocked;
 a pressure regulator in the supply line, the pressure regulator being upstream of the valve; and
 a control system comprising:
  a first flow rate or pressure switch in the supply line to switch at respectively a first flow rate or pressure of gas in the supply line, and
  a second flow rate or pressure switch in the supply line to switch at respectively a second flow rate or pressure of gas in the supply line,
  wherein the control system is configured to move the valve to the closed position from the open position if (i) a signal from the first switch, located downstream from the pressure regulator, indicates that gas in the supply line is above a first flow rate or pressure or (ii) a signal from the second switch, located downstream from the pressure regulator, indicates that gas in the supply line is below the second flow rate or pressure, and the lithographic apparatus comprises:
 a fluid handling system to provide a liquid to a space between a final element of a projection system and a facing surface and having a first gas outlet to supply a gas flow radially outward of a meniscus of liquid in the space;
 a second gas outlet radially outward of the first gas outlet to supply a flow of temperature conditioned gas onto an object; and
 a control system comprising a sensor to detect flow and/or pressure at or upstream of the second gas outlet, the control system configured to stop the supply of the gas flow radially outward of the meniscus of liquid if a signal from the sensor indicates that flow and/or pressure at or upstream of the second gas outlet is below a certain magnitude.

18. A lithographic apparatus comprising:

a carbon dioxide supply system to provide carbon dioxide from a source to a device; and a pump system, comprising:
 a liquid lubricated pump adapted to pump a gas;
 a first container to receive gas and liquid from the pump, the first container comprising an exhaust outlet to provide gas therethrough and comprising an overflow outlet below the exhaust outlet to provide liquid therethrough;
 a second container in fluid communication with the overflow outlet, the second container comprising a drain outlet;
 a pump downstream of the drain outlet; and
 a check valve, downstream of the pump, configured to open at an upstream pressure over a certain magnitude; and
 a pressure sensor to generate a signal indicative of a pressure of gas in a line connecting the pump to the check valve; and a control system configured to generate a stop signal if a signal from the pressure sensor indicates that the pressure of gas in the line connecting the pump to the check valve is below a certain magnitude.

19. A lithographic apparatus comprising:

a carbon dioxide supply system to provide carbon dioxide from a source to a device; and a control system configured to turn off the carbon dioxide supply system if one or more of the following occurs:
 (i) a pressure sensor generates a signal indicative of a pressure of gas in a line connecting a pump to a check valve in an extraction system is below a certain magnitude;
 (ii) a sensor generates a signal indicative that a flow rate and/or pressure at or upstream of a gas outlet to provide a flow of temperature conditioned gas, separate from the carbon dioxide supply, is below a certain magnitude; and/or
 (iii) a signal from a flow rate or pressure switch indicates that gas in a supply line of the carbon dioxide supply system is above respectively a first flow rate or pressure or is below respectively a second flow rate or pressure, the switch being located downstream from a pressure regulator in the supply line and the pressure regulator being upstream of a gas valve in the supply line.

20. A method of controlling supply of carbon dioxide, wherein the carbon dioxide supply is turned off if one or more of the following occurs:
 (i) a pressure sensor generates a signal indicative of a pressure of gas in a line connecting a pump to a check valve in an extraction system is below a certain magnitude;
 (ii) a sensor generates a signal indicative that flow rate and/or pressure at or upstream of a gas outlet to provide a flow of temperature conditioned gas, separate from the carbon dioxide supply, is below a certain magnitude; and/or (iii) a signal from a flow rate or pressure switch indicates that gas in a supply line of the carbon dioxide supply system is above respectively a first flow rate or pressure or is below respectively a second flow rate or pressure, the switch being located downstream from a pressure regulator in the supply line and the pressure regulator being upstream of a gas valve in the supply line.

* * * * *